(12) United States Patent
Park

(10) Patent No.: US 9,013,951 B2
(45) Date of Patent: Apr. 21, 2015

(54) WORD LINE DRIVERS AND SEMICONDUCTOR MEMORY DEVICES INCLUDING THE SAME

(71) Applicant: SK Hynix Inc., Icheon-si, Gyeonggi-do (KR)

(72) Inventor: Sang Il Park, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/079,820

(22) Filed: Nov. 14, 2013

(65) Prior Publication Data
US 2014/0369149 A1  Dec. 18, 2014

(30) Foreign Application Priority Data
Jun. 17, 2013  (KR) .................. 10-2013-0069282

(51) Int. Cl.
*G11C 8/00* (2006.01)
*G11C 8/08* (2006.01)
*G11C 8/10* (2006.01)

(52) U.S. Cl.
CPC ... *G11C 8/08* (2013.01); *G11C 8/10* (2013.01)

(58) Field of Classification Search
CPC .... G11C 11/4085; G11C 8/14; G11C 7/1027; G11C 8/18
USPC .......................... 365/230.06, 63, 203, 230.01
See application file for complete search history.

(56) References Cited

FOREIGN PATENT DOCUMENTS

KR  1020070019066 A  2/2007
KR  1020100128642 A  12/2010

*Primary Examiner* — Thong Q Le
(74) *Attorney, Agent, or Firm* — William Park & Associates Patent Ltd.

(57) ABSTRACT

Word line drivers including a selection signal generator and a word line drive unit are provided. The selection signal generator generates a selection signal which is enabled according to a high-order address signal and a low-order address signal in an active mode. Further, the selection signal generator generates a complementary selection signal which is enabled when an equalization signal is inputted in a pre-charge mode after the active mode. The word line driver receives the main word line signal to drive a word line to have a first level when the selection signal is enabled, to drive the word line to have a second level when the selection signal is disabled, and to drive the word line to have a third level when the complementary selection signal is enabled.

22 Claims, 5 Drawing Sheets

WORD LINE DRIVERS AND SEMICONDUCTOR MEMORY DEVICES INCLUDING THE SAME

CROSS-REFERENCE TO RELATED APPLICATION

The present application claims priority under 35 U.S.C 119(a) to Korean Application No. 10-2013-0069282, filed on Jun. 17, 2013, in the Korean Intellectual Property Office, which is incorporated herein by reference in its entirety as set forth in full.

BACKGROUND

1. Technical Field

Embodiments of the present disclosure generally relate to semiconductor devices and, more particularly, to word line drivers and semiconductor memory devices including the same.

2. Related Art

Each semiconductor memory device may include word lines, bit lines and memory cells and may store or output data by using the word lines, the bit lines and the memory cells. Each memory cell may include a single cell transistor and a single cell capacitor, and the data may be stored in the cell capacitors of the memory cells. In general, the word lines may be connected to gates of the cell transistors to control switching operations of the cell transistors.

When one of the word lines is selected to receive or output the data, the selected word line may be driven to have a high voltage (generally, denoted by a reference designator "VPP"). The cell transistors connected to the selected word line may be turned on by the high voltage VPP applied to the gates of the cell transistors. In such a case, the cell capacitors and the bit lines connected to the selected word line may share charges through the turned-on cell transistors to receive or output the data.

In the event that the word lines are not selected, the non-selected word lines may be driven to have a low voltage (generally, denoted by a reference designator "VBBW"). Thus, the cell transistors connected to the non-selected word line may be turned off by the low voltage VBBW applied to the gates of the cell transistors. In such a case, the cell capacitors and the bit lines connected to the non-selected word line do not share charges because of the turned-off cell transistors. The charge sharing phenomenon means that the cell capacitor and the bit line are electrically connected to each other through the turned-on cell transistor such that charges freely move between the cell capacitor and the bit line. As a result, the amount of the charges of each of the cell capacitor and the bit line may be changed. The high voltage VPP may be generated using a pump circuit to have a voltage level which is higher than a power voltage (generally, denoted by a reference designator "VDD"), and the low voltage VBBW may be generated using another pump circuit to have a voltage level which is lower than a ground voltage (generally, denoted by a reference designator "VSS"). For example, the non-selected word lines may be driven to have a negative voltage in order to minimize the leakage currents of the cell transistors connected to the non-selected word lines. That is, a negative word line scheme may be employed when the word lines are not selected.

However, when the word line having the high voltage VPP is driven to have the low voltage VBBW, a time it takes a level of the word line to reach the low voltage VBBW may increase due to an increased voltage difference between the high voltage VPP and the low voltage VBBW. If the time it takes the word line to reach the low voltage VBBW increases, undesired data may be stored in the cell capacitor of the memory cell connected to the word line to cause a malfunction.

SUMMARY

Various embodiments are directed to word line drivers and semiconductor memory devices including the same.

According to some embodiments, a semiconductor memory device includes a command decoder and a word line driver. The command decoder generates a main word line signal in an active mode, generates a control signal in a standby mode, and generates an equalization signal in a pre-charge mode. The word line driver drives a word line to a first level in response to the main word line signal, drives the word line to a second level in response to the control signal, and drives the word line to a third level in response to the equalization signal.

According to further embodiments, a word line driver includes a selection signal generator and a word line drive unit. The selection signal generator generates a selection signal which is enabled according to a high-order address signal and a low-order address signal in an active mode, and generates a complementary selection signal which is enabled when an equalization signal is inputted in a pre-charge mode after the active mode. The word line drive unit receives the main word line signal to drive a word line to have a first level when the selection signal is enabled, to drive the word line to have a second level when the selection signal is disabled, and to drive the word line to have a third level when the complementary selection signal is enabled.

According to further embodiments, a semiconductor memory device includes a command decoder and a word line driver. The command decoder generates a main word line signal, generates a control signal, and generates an equalization signal. The word line driver drives a word line to a first level in response to the main word line signal, drives the word line to a second level in response to the control signal, and drives the word line to a third level in response to the equalization signal.

BRIEF DESCRIPTION OF THE DRAWINGS

Embodiments of the present invention will become more apparent in view of the attached drawings and accompanying detailed description, in which.

DETAILED DESCRIPTION

Embodiments of the present invention will be described hereinafter with reference to the accompanying drawings. However, the embodiments described herein are for illustrative purposes only and are not intended to limit the scope of the invention.

Figure 1:
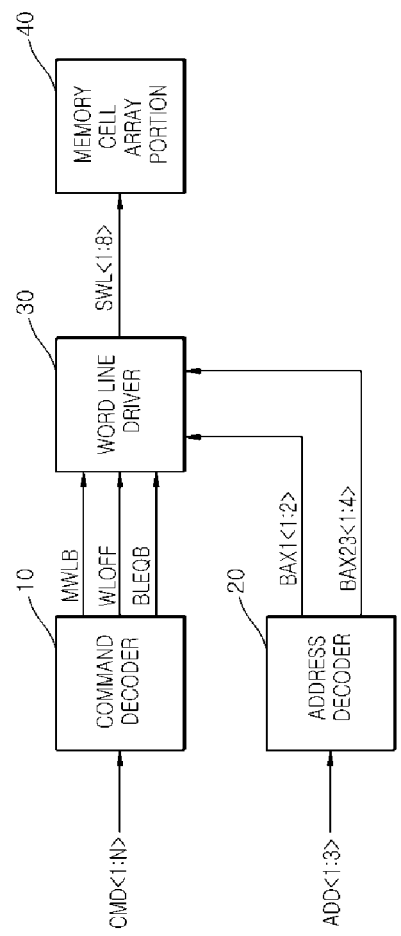
FIG. 1 is a block diagram illustrating a semiconductor memory device according to some embodiments of the present invention.

Referring to FIG. 1, a semiconductor memory device according to some embodiments of the present invention may include a command decoder 10, an address decoder 20, a word line driver 30 and a memory cell array portion 40.

The command decoder 10 may decode command signals CMD<1:N> supplied from an external device to generate a main word line signal MWLB in an active mode. Further, the command decoder 10 may decode the command signals CMD<1:N> to generate a control signal WLOFF in a standby mode. Moreover, the command decoder 10 may decode the command signals CMD<1:N> to generate an equalization signal BLEQB in a pre-charge mode. In some embodiments, the command signals CMD<1:N> may be set to have a plurality of bits in the active mode, the standby mode and the pre-charge mode. The equalization signal BLEQB may be enabled at point of time that the pre-charge mode starts after the standby mode. That is, the equalization signal BLEQB may be enabled after a predetermined time elapses from a point of time that the control signal WLOFF is generated.

The address decoder 20 may decode first to third address signals ADD<1:3> supplied from an external device to generate first and second high-order address signals BAX1<1:2> and first to fourth low-order address signals BAX23<1:4> in the active mode.

The word line driver 30 may selectively drive one of first to eighth word lines SWL<1:8> to have a first level according to a logic combination of the first and second high-order address signals BAX1<1:2> and the first to fourth low-order address signals BAX23<1:4> when the main word line signal MWLB is inputted in the active mode. Further, the word line driver 30 may drive the first to eighth word lines SWL<1:8> to have a second level when the control signal WLOFF is inputted in the standby mode. Moreover, the word line driver 30 may drive the first to eighth word lines SWL<1:8> to have a third level when the equalization signal BLEQB is inputted in the pre-charge mode. The first level may correspond to a level of the high voltage VPP, and the second level may correspond to a level of the ground voltage VSS. In addition, the third level may correspond to a level of the low voltage VBBW.

The memory cell array portion 40 may receive or output the data according to the first to eighth word lines SWL<1:8>, one of which is selectively driven to have the first level.

A configuration of the word line driver 30 will be described more fully hereinafter with reference to FIG. 2.

Figure 2:
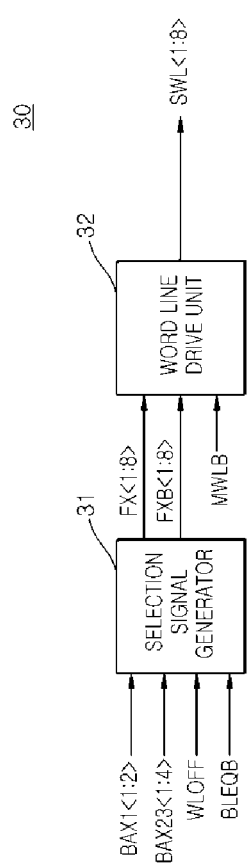
FIG. 2 is a block diagram illustrating a word line driver included in the semiconductor memory device of FIG. 1.

Referring to FIG. 2, the word line driver 30 may include a selection signal generator 31 and a word line drive unit 32.

The selection signal generator 31 may generate first to eighth selection signals FX<1:8>, one of which has the high voltage VPP according to a logic combination of the first and second high-order address signals BAX1<1:2> and the first to fourth low-order address signals BAX23<1:4> in the active mode. Further, the selection signal generator 31 may receive the control signal WLOFF to generate the first to eighth selection signals FX<1:8> having the ground voltage VSS in the standby mode. Furthermore, the selection signal generator 31 may inversely buffer the first to eighth selection signals FX<1:8> in response to the equalization signal BLEQB to generate first to eighth complementary selection signals FXB<1:8> in the pre-charge mode.

The word line drive unit 32 may receive the main word line signal MWLB to selectively drive one of the first to eighth word lines SWL<1:8> to have the high voltage VPP according to the first to eighth selection signals FX<1:8> in the active mode. Further, the word line drive unit 32 may drive the first to eighth word lines SWL<1:8> to have the ground voltage VSS in the standby mode. Moreover, the word line drive unit 32 may drive the first to eighth word lines SWL<1:8> to have the low voltage VBBW according to the first to eighth complementary selection signals FXB<1:8> in the pre-charge mode.

A configuration of the selection signal generator 31 will be described more fully hereinafter with reference to FIG. 3 in conjunction with an example that the first selection signal FX<1> is generated.

Figure 3:
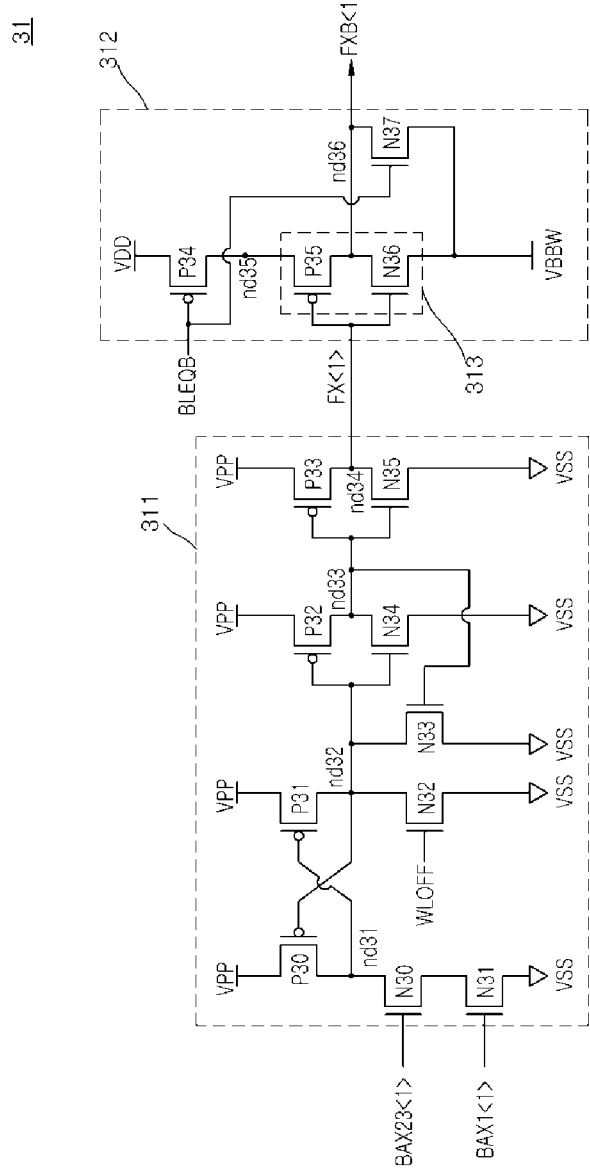
FIG. 3 is a circuit diagram illustrating a selection signal generator included in the word line driver of FIG. 2.

Referring to FIG. 3, the selection signal generator 31 may include a selection signal driver 311 and a buffer 312.

The selection signal driver 311 may include a PMOS transistor P30 located between a high voltage (VPP) terminal and a node ND31 to receive a signal on a node ND32, a PMOS transistor P30 located between the high voltage (VPP) terminal and the node ND32 to receive a signal on the node ND31, NMOS transistors N30 and N31 serially connected between the node ND31 and a ground voltage (VSS) terminal to receive respective ones of the first low-order address signal BAX23<1> and the first high-order address signals BAX1<1>, an NMOS transistor N32 located between the node ND32 and the ground voltage (VSS) terminal to receive the control signal WLOFF, an NMOS transistor N33 located between the node ND32 and the ground voltage (VSS) terminal to receive a signal on a node ND33, a PMOS transistor P32 and an NMOS transistor N34 serially connected between the high voltage (VPP) terminal and the ground voltage (VSS) terminal to receive a signal on the node ND32 and to transmit an output signal thereof to the node ND33, and a PMOS transistor P33 and an NMOS transistor N35 serially connected between the high voltage (VPP) terminal and the ground voltage (VSS) terminal to drive a node ND34 according to a signal on the node ND33 and to generate the first selection signal FX<1> on the node ND34. Each of circuits for generating the second to eighth selection signals FX<2:8> may have substantially the same configuration as the selection signal driver 311 illustrated in FIG. 3. Thus, descriptions to the circuits for generating the second to eighth selection signals FX<2:8> will be omitted.

The buffer 312 may include a PMOS transistor P34 located between a power voltage (VDD) terminal and a node ND35 to receive the equalization signal BLEQB, an NMOS transistor N37 located between a node ND36 and a low voltage (VBBW) terminal to receive the equalization signal BLEQB, a PMOS transistor P35 and an NMOS transistor N36 serially connected between the node ND35 and the low voltage (VBBW) terminal to inversely buffer the first selection signal FX<1> and to generate a first complementary selection signal FXB<1> through the node ND36. The PMOS transistor P35 and the NMOS transistor N36 may constitute a driver 313. The PMOS transistor P34 may act as a pull-up element, and the NMOS transistor N37 may act as a pull-down element. Each of circuits for generating the second to eighth complementary selection signals FXB<2:8> may have substantially the same configuration as the buffer 312 illustrated in FIG. 3. Thus, descriptions to the circuits for generating the second to eighth complementary selection signals FXB<2:8> will be omitted.

Hereinafter, an operation of the selection signal driver 311 will be described more fully in conjunction with an example that the first selection signal FX<1> is selected and the selection signal driver 311 operates in the active mode and in the standby mode.

First, in the active mode, the NMOS transistors N30 and N31 of the selection signal driver 311 may be turned on to drive the node ND31 to have the ground voltage VSS when the first low-order address signal BAX23<1> and the first high-order address signals BAX1<1> have a logic "high" level. The PMOS transistor P31 may be turned on in response to the ground voltage VSS on the node ND31 to drive the node ND32 to have the high voltage VPP. In such a case, the PMOS transistor P31 may be turned off because the node ND32 has the high voltage VPP. The NMOS transistor N34 may be tuned on to drive the node ND33 to have the ground voltage VSS because the node ND32 has the high voltage VPP. In such a case, the PMOS transistor P32 may be turned off because the node ND32 has the high voltage VPP, and the NMOS transistor N33 may be turned off because the node ND33 has the ground voltage VSS. The PMOS transistor P33 may be turned on to drive the node ND34 to have the high voltage VPP because the node ND33 has the ground voltage VSS. As a result, the first selection signal FX<1> on the node ND34 may be generated to have the high voltage VPP. In such a case, the NMOS transistor N35 may be turned off because the node ND33 has the ground voltage VSS. That is, the selection signal driver 311 may generate the first selection signal FX<1> having the high voltage VPP when the first low-order address signal BAX23<1> and the first high-order address signals BAX1<1> have a logic "high" level in the active mode.

Next, in the standby mode, the NMOS transistor N32 of the selection signal driver 311 may be turned on to drive the node ND32 to have the ground voltage VSS when the control signal WLOFF has a logic "high" level. In such a case, the NMOS transistors N30 and N31 may be turned off because the first low-order address signal BAX23<1> and the first high-order address signals BAX1<1> are not inputted. The PMOS transistor P32 may be turned on to drive the node ND33 to have the high voltage VPP because the node ND32 has the ground voltage VSS. In such a case, the NMOS transistor N34 may be turned off because the node ND32 has the ground voltage VSS, and the NMOS transistor N33 may be turned on to drive the node ND32 to have the ground voltage VSS because the node ND33 has the high voltage VPP. The NMOS transistor N35 may be turned on to drive the node ND34 to have the ground voltage VSS because the node ND33 has the high voltage VPP. As a result, the first selection signal FX<1> on the node ND34 may be generated to have the ground voltage VSS. In such a case, the PMOS transistor P33 may be turned off because the node ND33 has the high voltage VPP. That is, the selection signal driver 311 may generate the first selection signal FX<1> having the ground voltage VSS when the control signal WLOFF has a logic "high" level in the standby mode.

Hereinafter, an operation of the buffer 312 will be described more fully in conjunction with an example that the first selection signal FX<1> is selected and the buffer 312 operates in the standby mode and in the pre-charge mode.

First, in the standby mode, the PMOS transistor P34 of the buffer 312 may be turned off in response to the equalization signal BLEQB having a logic "high" level and the NMOS transistor N37 may be turned on to drive node ND36 to have the low voltage VBBW. Because the first selection signal FX<1> has the ground voltage VSS, the PMOS transistor P35 included in the driver 313 of the buffer 312 may be turned on and the NMOS transistor N36 included in the driver 313 of the buffer 312 may be turned off. That is, the buffer 312 may generate the first complementary selection signal FXB<1> having the low voltage VBBW in the standby mode.

Next, in the pre-charge mode, the PMOS transistor P34 of the buffer 312 may be turned on in response to the equalization signal BLEQB having a logic "low" level and the NMOS transistor N37 may be turned off to drive the node ND36 to have the power voltage VDD. Because the first selection signal FX<1> has the ground voltage VSS, the PMOS transistor P35 included in the driver 313 of the buffer 312 may be turned on to drive the node ND36 to have the power voltage VDD. In such a case, the NMOS transistor N36 included in the driver 313 may be turned off. That is, the buffer 312 may inversely buffer the first selection signal FX<1> to generate the first complementary selection signal FXB<1> having the power voltage VDD in the pre-charge mode.

A configuration of the word line drive unit 32 will be described more fully hereinafter with reference to FIG. 4 in conjunction with an example that the first word line SWL<1> is selectively driven.

Figure 4:
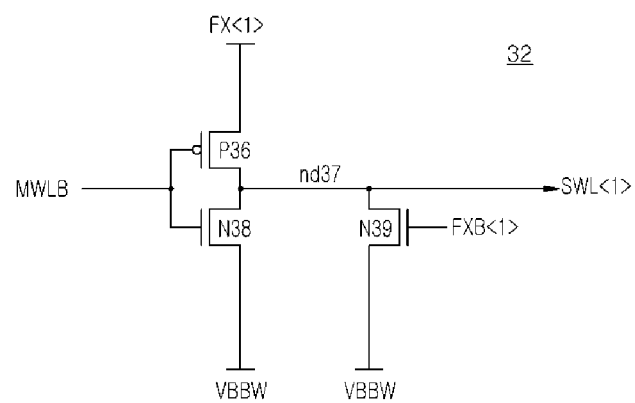
FIG. 4 is a circuit diagram illustrating a word line drive unit included in the word line driver of FIG. 2.
Figure 5:
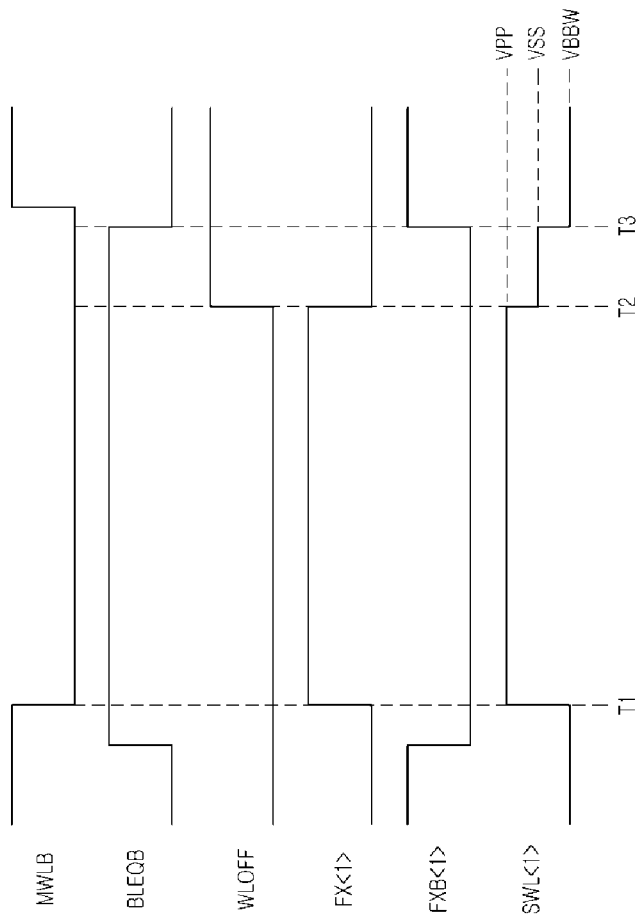
FIG. 5 is a timing diagram illustrating an operation of a semiconductor memory device according to some embodiments of the present invention.

Referring to FIG. 4, the word line drive unit 32 may include a PMOS transistor P36 located between a first selection signal FX<1> terminal (i.e., the node ND34 of FIG. 3) and a node ND37 to receive the main word line signal MWLB, an NMOS transistor N38 located between the node ND37 and the low voltage VBBW terminal to receive the main word line signal MWLB, and an NMOS transistor N39 located between the node ND37 and the low voltage VBBW terminal to receive the first complementary selection signal FXB<1>. The node ND37 may be electrically connected to the first word line SWL<1>. Each of circuits for driving the second to eighth word lines SWL<2:8> may have substantially the same configuration as the word line drive unit 32 illustrated in FIG. 4. Thus, descriptions to the circuits for driving the second to eighth word lines SWL<2:8> will be omitted.

Hereinafter, an operation of the word line drive unit 32 will be described more fully in conjunction with an example that the first word line SWL<1> is selectively driven and the word line drive unit 32 sequentially operates in the active mode, the standby mode and the pre-charge mode.

First, in the active mode, the PMOS transistor P36 of the word line drive unit 32 may be turned on in response to the main word line signal MWLB having a logic "low" level to drive the node ND37 to have a level of the first selection signal FX<1>. The NMOS transistor N38 may be turned off because the main word line signal MWLB has a logic "low" level. In such a case, the NMOS transistor N39 may be turned off because the first complementary selection signal FXB<1> has the low voltage VBBW. That is, the word line drive unit 32 may receive the first selection signal FX<1> having the high voltage VPP to drive the first word line SWL<1> to have the high voltage VPP in the active mode.

Next, in the standby mode, the PMOS transistor P36 of the word line drive unit 32 may be turned on in response to the main word line signal MWLB having a logic "low" level to drive the node ND37 to have a level of the first selection signal FX<1>. The NMOS transistor N38 may be turned off because the main word line signal MWLB has a logic "low" level. In such a case, the NMOS transistor N39 may be turned off because the first complementary selection signal FXB<1> has the ground voltage VSS. That is, the word line drive unit 32 may receive the first selection signal FX<1> having the ground voltage VSS to drive the first word line SWL<1> to have the ground voltage VSS in the standby mode.

Finally, in the pre-charge mode, the PMOS transistor P36 of the word line drive unit 32 may be turned on in response to the main word line signal MWLB having a logic "low" level to drive the node ND37 to have a level of the first selection signal FX<1>. The NMOS transistor N38 may be turned off because the main word line signal MWLB has a logic "low" level. In such a case, the NMOS transistor N39 may be turned on to drive the node ND37 to have the low voltage VBBW because the first complementary selection signal FXB<1> has the power voltage VDD. That is, the word line drive unit 32 may receive the first complementary selection signal FXB<1> having the power voltage VDD to drive the first word line SWL<1> to have the low voltage VBBW in the pre-charge mode.

An operation of the semiconductor memory device according to the aforementioned embodiments will be described with reference to FIGS. 1 to 5 in conjunction with an example that the first word line SWL<1> is sequentially driven in the active mode, the standby mode and the pre-charge mode.

Referring to FIGS. 1 to 5, if the active mode starts at a point of time "T1", the command decoder 10 may decode the command signals CMD<1:N> to generate the main word line signal MWLB having a logic "low" level. The address decoder 20 may decode the first to third address signals ADD<1:3> to generate the first high-order address signal BAX1<1> having a logic "high" level and the first low-order address signal BAX 23<1> having a logic "high" level. The selection signal generator 31 may receive the first high-order address signal BAX1<1> and the first low-order address signal BAX23<1> to generate the first selection signal FX<1> having a first level. The first level may be a voltage level of the high voltage VPP. The word line drive unit 32 may receive the main word line signal MWLB having a logic "low" level to drive the first word line SWL<1> to have a level of the first selection signal FX<1>. That is, the word line drive unit 32 may drive the first word line SWL<1> to have the high voltage VPP. The memory cell array portion 40 may have selected memory cells connected to the first word line SWL<1> and the selected memory cells may store data supplied form an external device therein or may output the data stored therein.

Next, if the standby mode starts at a point of time "T2", the command decoder 10 may decode the command signals CMD<1:N> to generate the control signal WLOFF having a logic "high" level. The selection signal generator 31 may receive the control signal WLOFF having a logic "high" level to generate the first selection signal FX<1> having a second level. The second level may be a voltage level of the ground voltage VSS. The word line drive unit 32 may receive the main word line signal MWLB having a logic "low" level to drive the first word line SWL<1> to have a level of the first selection signal FX<1>. That is, the word line drive unit 32 may drive the first word line SWL<1> to have the ground voltage VSS.

Subsequently, if the pre-charge mode starts at a point of time "T3", the command decoder 10 may decode the command signals CMD<1:N> to generate the equalization signal BLEQB having a logic "low" level. That is, the command decoder 10 may generate the equalization signal BLEQB having a logic "low" level at the point of time "T3" that a predetermined time elapses from the point of time "T2" that the control signal WLOFF is enabled. The selection signal generator 31 may receive the equalization signal BLEQB having a logic "low" level to generate the first complementary selection signal FXB<1> having a logic "high" level. The word line drive unit 32 may receive the first complementary selection signal FXB<1> having a logic "high" level to drive the first word line SWL<1> to have a third level. The third level may be a voltage level of the low voltage VBBW. That is, the word line drive unit 32 may drive the first word line SWL<1> to have the low voltage VBBW in the pre-charge mode.

As described above, the semiconductor memory device according to the embodiments of the present invention may lower a level of a selected word line from a high voltage level to a ground voltage level in a standby mode and may lower the level of the selected word line having the ground voltage level to a low voltage level in a pre-charge mode. Thus, a time it takes a level of the selected word line to reach the low voltage may be reduced to prevent data loss of memory cells connected to the selected word line. Further, the semiconductor memory device according to the embodiments may reduce a time that the low voltage generated by a charge pumping circuit is used. Thus, power consumption of the semiconductor memory device can be reduced.

What is claimed is:

1. A semiconductor memory device comprising:
   a command decoder configured to generate a main word line signal in an active mode, configured to generate a control signal in a standby mode, and configured to generate an equalization signal in a pre-charge mode; and
   a word line driver configured to drive a word line to a first level in response to the main word line signal, configured to drive the word line to a second level in response to the control signal, and configured to drive the word line to a third level in response to the equalization signal,
   wherein the first level is higher than the second level and the second level is higher than the third level.

2. The semiconductor memory device of claim 1, wherein the equalization signal is enabled after a predetermined time elapses from a point of time that the control signal is enabled.

3. The semiconductor memory device of claim 1, further comprising an address decoder configured to receive and decode an address signal to generate a high-order address signal and a low-order address signal in the active mode.

4. The semiconductor memory device of claim 3, wherein the word line driver includes:
   a selection signal generator configured to generate a selection signal which is enabled according to a logic combination of the high-order address signal and the low-order address signal and configured to inversely buffer the selection signal in response to the equalization signal to generate a complementary selection signal; and
   a word line drive unit configure to receive the main word line signal to drive the word line to have the first level when the selection signal is enabled, to drive the word line to have the second level when the selection signal is disabled, and to drive the word line to have the third level when the complementary selection signal is enabled.

5. The semiconductor memory device of claim 4, wherein the selection signal generator generates the selection signal having the first level when the word line is selected according to a logic combination of the high-order address signal and the low-order address signal.

6. The semiconductor memory device of claim 5, wherein the selection signal generator generates the first selection signal having the second level in response to the control signal which is enabled in the standby mode.

7. The semiconductor memory device of claim 6, wherein the selection signal generator includes:
   a selection signal driver configured to generate the selection signal having the first level when the word line is selected according to the high-order address signal and the low-order address signal and configured to generate the selection signal having the second level when the control signal is enabled; and
   a buffer configured to inversely buffer the selection signal to generate the complementary selection signal when the equalization signal is enabled and configured to generate the complementary selection signal having the third level when the equalization signal is disabled.

8. The semiconductor memory device of claim 7, wherein the buffer includes:

a pull-up element located between a power voltage terminal and a first node to pull up a level of the first node when the equalization signal is enabled;

a driver located between the first node and a third level terminal to inversely buffer the selection signal and to output the complementary selection signal through a second node when the first node is pulled up; and a pull-down element located between the second node and the third level terminal to pull down a level of the second node when the equalization signal is disabled, wherein the power voltage terminal is a terminal supplying a power voltage and the third level terminal is a terminal supplying a voltage having the third level.

9. The semiconductor memory device of claim 4, wherein the word line drive unit includes:

a first drive element turned on to drive a third node connected to the word line to a level of the selection signal having the first level or the second level when the main word line signal is enabled;

a second drive element turned on to drive the third node to the third level when the complementary selection signal is enabled; and a third drive element turned on to drive the third node to the third level when the main word line signal is disabled.

10. A word line driver comprising:

a selection signal generator configured to generate a selection signal which is enabled according to a high-order address signal and a low-order address signal in an active mode, configured to generate a complementary selection signal which is enabled when an equalization signal is inputted in a pre-charge mode after the active mode; and a word line drive unit configure to receive the main word line signal to drive a word line to have a first level when the selection signal is enabled, to drive the word line to have a second level when the selection signal is disabled, and to drive the word line to have a third level when the complementary selection signal is enabled.

11. The word line driver of claim 10, wherein the equalization signal is enabled at a point of time that the pre-charge mode starts after a standby mode terminates.

12. The word line driver of claim 10, wherein the selection signal is a signal for driving the word line connected to memory cells in the active mode.

13. The word line driver of claim 10, wherein the first level is higher than the second level and the second level is higher than the third level.

14. The word line driver of claim 10, wherein the high-order address signal and the low-order address signal are generated by receiving and decoding an address signal, and is used to select the word line.

15. The word line driver of claim 10, wherein the selection signal generator generates the selection signal having the first level when the word line is selected according to a logic combination of the high-order address signal and the low-order address signal.

16. The word line driver of claim 15, wherein the selection signal generator generates the first selection signal having the second level in response to the control signal which is enabled in a standby mode.

17. The word line driver of claim 16, wherein the selection signal generator includes:

a selection signal driver configured to generate the selection signal having the first level when the word line is selected according to the high-order address signal and the low-order address signal and configured to generate the selection signal having the second level when the control signal is enabled; and a buffer configured to inversely buffer the selection signal to generate the complementary selection signal when the equalization signal is enabled and configured to generate the complementary selection signal having the third level when the equalization signal is disabled.

18. The word line driver of claim 17, wherein the buffer includes:

a pull-up element located between a power voltage terminal and a first node to pull up a level of the first node when the equalization signal is enabled;

a driver located between the first node and a third level terminal to inversely buffer the selection signal and to output the complementary selection signal through a second node when the first node is pulled up; and a pull-down element located between the second node and the third level terminal to pull down a level of the second node when the equalization signal is disabled, wherein the power voltage terminal is a terminal supplying a power voltage and the third level terminal is a terminal supplying a voltage having the third level.

19. The word line driver of claim 10, wherein the word line drive unit includes:

a first drive element turned on to drive a third node connected to the word line to a level of the selection signal having the first level or the second level when the main word line signal is enabled;

a second drive element turned on to drive the third node to the third level when the complementary selection signal is enabled; and a third drive element turned on to drive the third node to the third level when the main word line signal is disabled.

20. A semiconductor memory device comprising:

a command decoder configured to generate a main word line signal, configured to generate a control signal, and configured to generate an equalization signal; and a word line driver configured to drive a word line to a first level in response to the main word line signal, configured to drive the word line to a second level in response to the control signal, and configured to drive the word line to a third level in response to the equalization signal, wherein the first level is higher than the second level and the second level is higher than the third level.

21. The semiconductor memory device of claim 20, wherein the command decoder is configured to:

generate the main word line signal in an active mode;
generate the control signal in a standby mode; and
generate the equalization signal in a pre-charge mode.

22. The semiconductor memory device of claim 20, wherein the equalization signal is enabled after a predetermined time elapses from a point of time that the control signal is enabled.

* * * * *